US011515432B2

(12) United States Patent
Salahuddin et al.

(10) Patent No.: US 11,515,432 B2
(45) Date of Patent: Nov. 29, 2022

(54) COOL ELECTRON ERASING IN THIN-FILM STORAGE TRANSISTORS

(71) Applicant: SUNRISE MEMORY CORPORATION, Fremont, CA (US)

(72) Inventors: Sayeef Salahuddin, Walnut Creek, CA (US); George Samachisa, Atherton, CA (US); Wu-Yi Henry Chien, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

(21) Appl. No.: 17/155,673

(22) Filed: Jan. 22, 2021

(65) Prior Publication Data
US 2021/0226071 A1    Jul. 22, 2021

Related U.S. Application Data

(60) Provisional application No. 62/992,754, filed on Mar. 20, 2020, provisional application No. 62/964,472, filed on Jan. 22, 2020.

(51) Int. Cl.
H01L 21/8239    (2006.01)
H01L 29/792    (2006.01)
H01L 27/11568    (2017.01)
H01L 29/51    (2006.01)
H01L 29/423    (2006.01)

(52) U.S. Cl.
CPC ...... H01L 29/792 (2013.01); H01L 27/11568 (2013.01); H01L 29/4234 (2013.01); H01L 29/513 (2013.01); H01L 29/517 (2013.01)

(58) Field of Classification Search
CPC .................................................. H01L 29/513
See application file for complete search history.

(56) References Cited

U.S. PATENT DOCUMENTS 9,391,084 B2    7/2016 Lue
2008/0054346 A1    3/2008 Saitoh et al.
(Continued)

OTHER PUBLICATIONS

Park, Goon-Ho , et al., "Electrical Characteristics of SiO2/High-k Dielectric Stacked Tunnel Barriers for Nonvolatile Memory Applications", Journal of the Korean Physical Society, vol. 55, No. 1, Jul. 2009, pp. 116-119.

(Continued)

Primary Examiner — Mohammad M Choudhry
(74) Attorney, Agent, or Firm — Edward C. Kwok; VLP Law Group LLP

(57) ABSTRACT

A storage transistor has a tunnel dielectric layer and a charge-trapping layer between a channel region and a gate electrode, wherein the charge-tapping layer has a conduction band offset that is less than the lowering of the tunneling barrier in the tunnel dielectric layer when a programming voltage is applied, such that electrons direct tunnel into the charge-trapping layer. The conduction band of the charge-trapping layer is has a value between −1.0 eV and 2.3 eV. The storage transistor may further include a barrier layer between the tunnel dielectric layer and the charge-trapping layer, the barrier layer having a conduction band offset less than the conduction band offset of the charge-trapping layer.

31 Claims, 13 Drawing Sheets

(56) References Cited

U.S. PATENT DOCUMENTS

2009/0140318 A1\* 6/2009 Dong .................... H01L 29/513
                                                    257/E29.17
2012/0146126 A1   6/2012 Lai et al.
2019/0006015 A1   1/2019 Norman et al.

OTHER PUBLICATIONS

Tan, Yan-Ny, et al., "Over-Erase Phenomenon in SONOS-Type Flash Memory and its Minimization Using a Hafnium Oxide Charge Storage Layer", IEEE Transactions On Electron Devices, vol. 51, No. 7, Jul. 2004, pp. 1143-1147.

\* cited by examiner

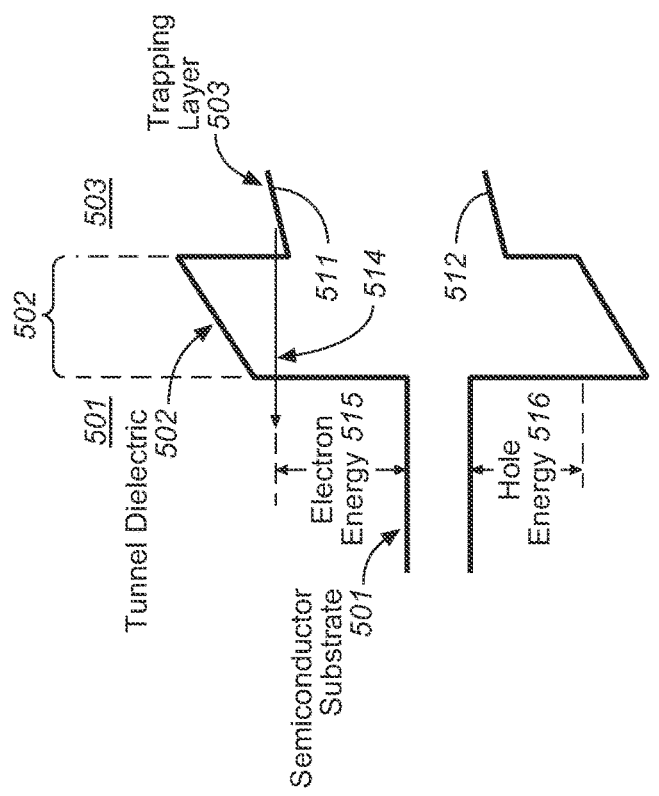
FIG. 5
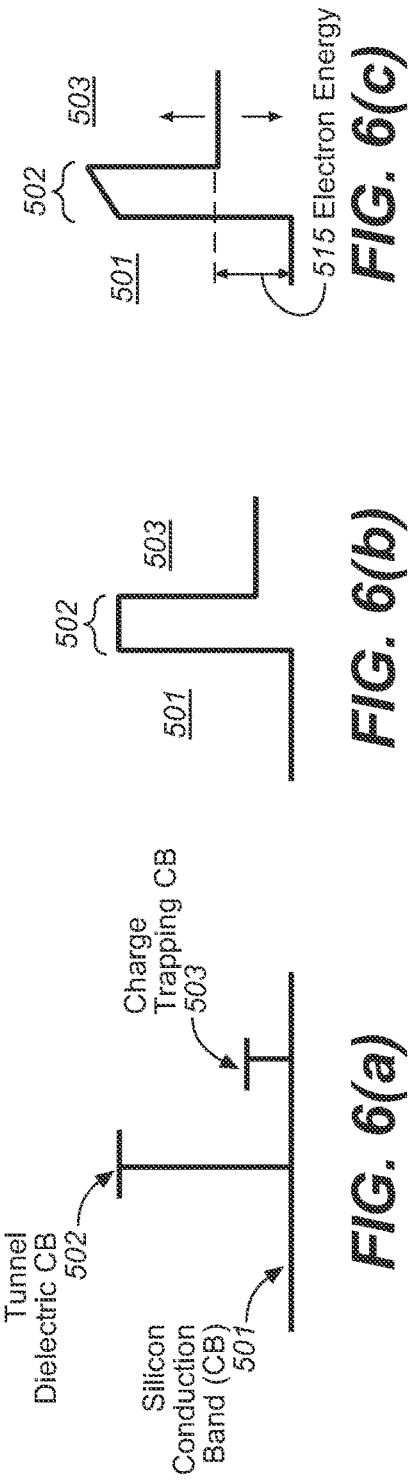
FIG. 6(a)
FIG. 6(b)
FIG. 6(c)

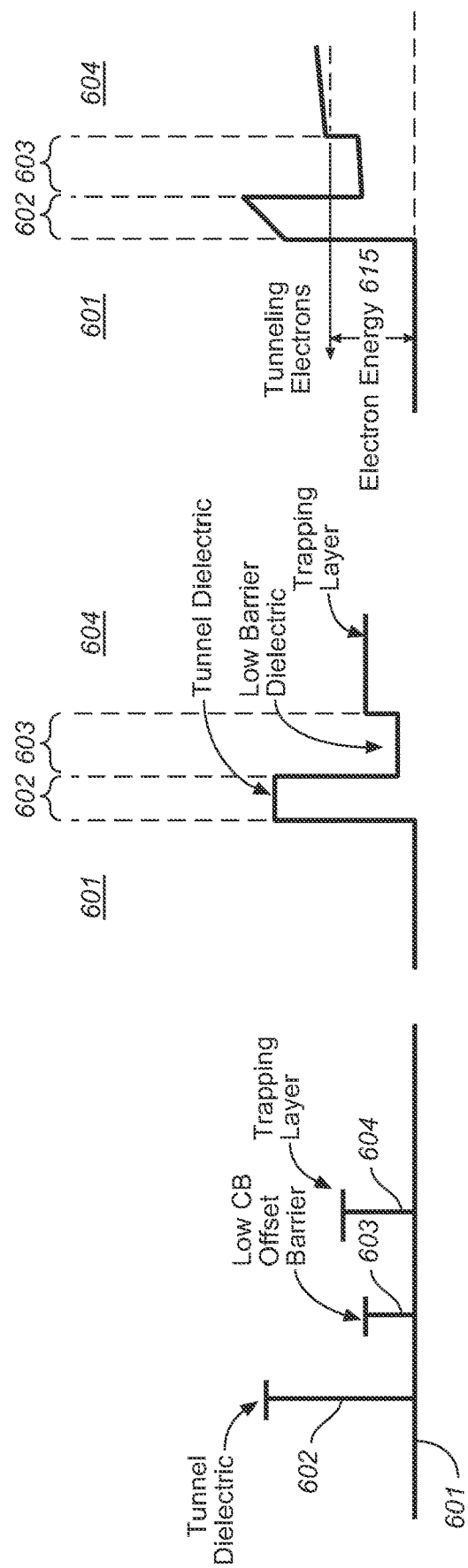

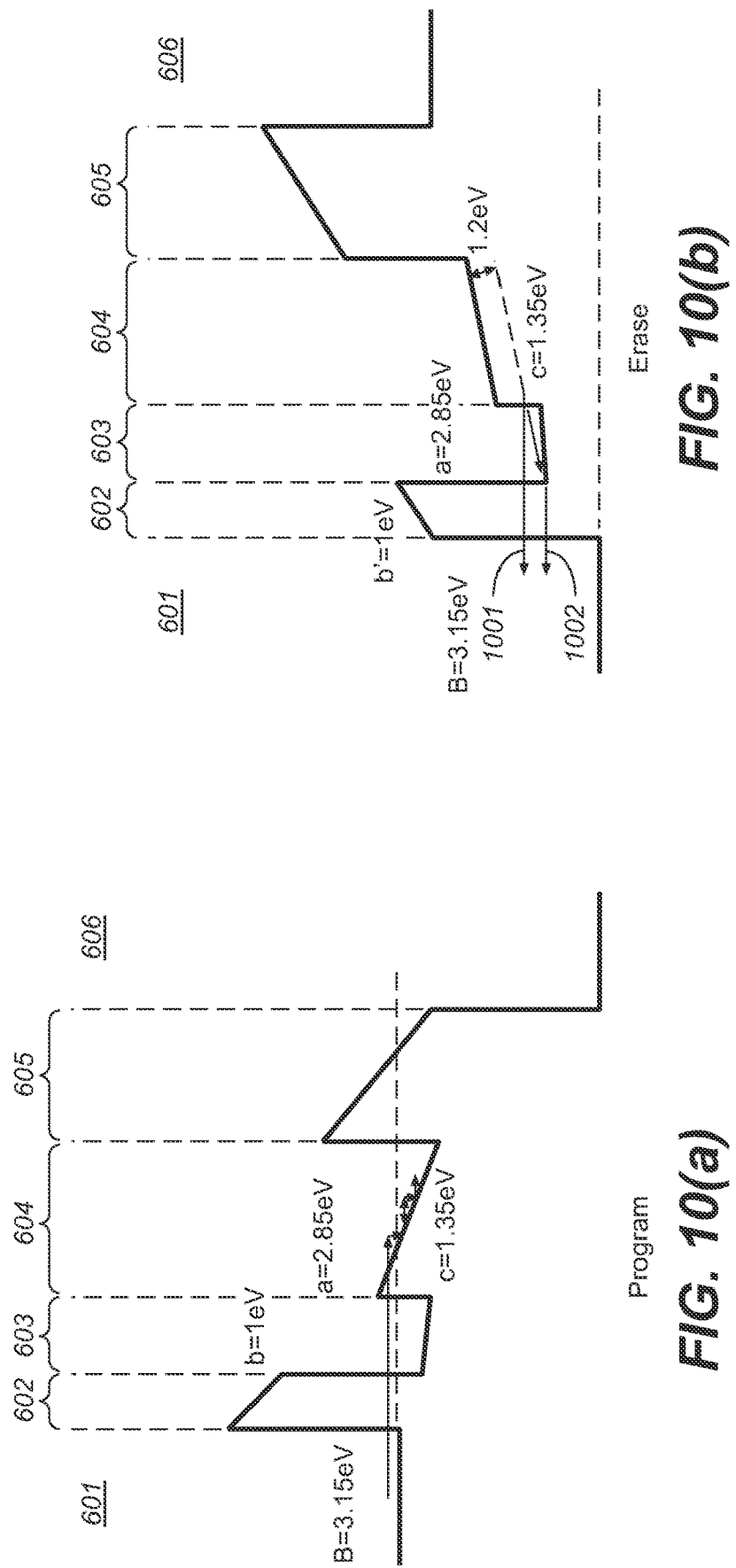

COOL ELECTRON ERASING IN THIN-FILM STORAGE TRANSISTORS

CROSS REFERENCE TO RELATED APPLICATIONS

The present application relates to and claims priority of: (i) U.S. provisional patent application ("Provisional Application I"), Ser. No. 62,964,472, entitled "Cool Electron Erasing In Thin-film Storage Transistors," filed on Jan. 22, 2020, and (ii) U.S. provisional patent application ("Provisional Application II"), Ser. No. 62/992,754, entitled "Cool Electron Erasing In Thin-film Storage Transistors," filed on Mar. 20, 2020. The disclosures of Provisional Applications I and II are hereby incorporated by reference in their entireties.

BACKGROUND OF THE INVENTION

1. Field of the Invention

The present invention relates to programming and erasing schemes in thin-film storage transistors. In particular, the present invention relates to using cool electrons for fast programming and fast erase operations in a thin-film transistor, which also provides the additional benefit of achieving high endurance.

2. Discussion of the Related Art

U.S. Patent Application Publication 2019/0006015 ("Harari"), entitled "Capacitive-Coupled Non-Volatile Thin-Film Transistor Strings in Three-Dimensional Arrays," published on Jan. 3, 2019, discloses thin-film storage transistors organized as NOR memory strings. Harari's thin-film transistors may be programmed and erased in 100 nanosecond (ns) or less, rendering them suitable for use in many applications of conventional volatile memory devices, such as dynamic random-access memory (DRAM) devices. Harari's thin-film storage transistors also have an advantage of a retention time in minutes, rather than milliseconds, as typical of conventional DRAM devices. Therefore, one may refer to Harari's thin-film storage transistors as quasi-volatile storage transistors. In many applications, such a quasi-volatile storage transistor should preferably have a high endurance (e.g., in the range of $10^{11}$ cycles) and may preferably be programed or erased using voltages of about 8-9 volts or lower.

Fast programming and fast erase operations require relatively high currents through the gate stack of the storage transistor. FIG. 1 is an energy band diagram of a portion of a storage transistor, which includes multiple sublayers of dielectric materials and stores charge between a channel region and a gate electrode. As shown in FIG. 1, various materials 120 between channel region 110 and gate electrode 114 allow data storage in the storage transistor. These materials include tunnel dielectric sublayer 111, charge-trapping sublayer 112 (e.g., silicon nitride) and blocking dielectric sublayer 113 (e.g., silicon oxide). Charge-trapping sublayer 112 and blocking dielectric sublayer 113 may each be, for example, 4 nm thick. In FIG. 1, line 101 traces the lowest energy states in the conduction bands of the various materials and line 102 traces the highest energy states in the valence bands of the various materials. In such a system, to change the threshold voltage of the storage transistor by one volt in 100 ns requires a programming current density of about 5.0 amps/cm². Using silicon dioxide as tunneling dielectric sublayer 111, such a high current density may be achieved at a moderate electric field in the range of 10.0 MV/cm through a direct tunneling mechanism.

FIG. 2 shows some typical direct tunneling current densities (gate currents) for various silicon dioxide thicknesses under different bias conditions. As shown in FIG. 2, the desired high current density (e.g., 5.0 amps/cm²) may be achieved in silicon dioxide for thicknesses less than 1.5 nm, even for voltages below 1.5 volts across the silicon dioxide layer.

FIGS. 3(a) and 3(b) illustrate, respectively, direct tunneling of electrons into charge-trapping sublayer 112 and out of charge-trapping sublayer 112 during programming and erase operations. As illustrated in FIG. 3(a), the applied programming voltage across gate electrode 114 and channel region 110 lowers the conduction bands of tunnel dielectric sublayer 111, charge-trapping sublayer 112 and blocking dielectric sublayer 113 relative to channel region 110. Specifically, the lowest energy levels in the conduction band of charge-trapping sublayer 112 is lowered to slightly below that of channel region 110 to allow electrons with energy at the lowest energy levels of the conduction band in channel region 110 to direct-tunnel into charge-trapping sublayer 112, as illustrated by arrow 301 in FIG. 3(a).

Likewise, as illustrated in FIG. 3(b), the applied erase voltage across gate electrode 114 and channel region 110 raises the lowest energy levels in the conduction bands of tunnel dielectric sublayer 111, charge-trapping sublayer 112 and blocking dielectric sublayer 113 relative to those of channel region 110. The electric field imparts energy to electrons at the allowed energy levels of the charge-trapping sites in charge-trapping sublayer 112 to direct tunnel into channel region 110, as illustrated by arrow 302 in FIG. 3(b).

The direct tunneling mechanisms by electrons illustrated in FIGS. 3(a) and 3(b) allow fast programming and erase. In contrast, erasing by holes is a slow mechanism. In a floating-substrate quasi-volatile storage cell (e.g., Harari's thin-film storage transistor), for example, holes in channel region 110 are insufficient to provide an adequate hole current into charge-trapping sublayer 112; the likely erase mechanism for such a storage transistor pulls electrons out from charge-trapping sublayer 112.

In a storage transistor, the voltage difference between the threshold voltages of the storage transistor in the erased state and in the programmed state is referred to as the "programming window." The programming window narrows or closes with the number of cycles the storage transistor has been programmed and erased. Such programming window narrowing is due to, for example, degradation at the interface between channel region 110 and tunnel dielectric 111, as a result of interface states formation. Programming window narrowing may also result from charge-trapping at other material interfaces, e.g., between charge-trapping sublayer 112 and blocking dielectric sublayer 113. The endurance of a storage transistor refers to the number of program-erase cycles before the storage transistor fails to maintain an acceptable programming window. As illustrated in FIG. 3(a), electrons that direct tunnel from channel region 110 to charge-trapping sublayer 112 have low energy entering charge-trapping sublayer 112, so that they give up only a small amount of energy settling in the lowest allowed energy states in charge-trapping sublayer 112 (i.e., the lowest energy levels in the conduction bands of channel region 110 and charge-trapping sublayer 112 are very close in the presence of the programming voltage). This energy loss does not cause any appreciable damage to charge-trapping sublayer 112. In contrast, as illustrated in FIG. 3(b), the energy loss by electrons entering channel region 110 during an erase operation is significantly larger. The greater energy loss generates energetic holes ("hot holes") in channel region 110, which would be driven by the electric field of the erase voltage towards gate electrode 114. These hot holes create interface traps at the interface between channel region 110 and tunnel dielectric sublayer 111. These interface traps are detrimental to the endurance of the storage transistor and, in fact, may be primarily responsible for the programming window closing. One of ordinary skill in the art may also recognize that the hot holes phenomenon, known as the "anode hot hole injection mechanism," provides one model for dielectric breakdown.

FIG. 4 illustrates the evolution of the programming window in a storage transistor over more than $10^9$ program and erase cycles, showing program state threshold voltage 401 and erase state threshold voltage 402.

SUMMARY

According to one embodiment of the present invention, a storage transistor has a tunnel dielectric layer and a charge-trapping layer between a channel region and a gate electrode, wherein the charge-tapping layer has a conduction band offset—relative to a n-type silicon conduction band—that is less than the lowering of the tunneling barrier in the tunnel dielectric layer when a programming voltage is applied, such that electrons direct tunnel into the charge-trapping layer. The conduction band offset of the charge-trapping layer is selected to have a value between $-1.0$ eV and 2.3 eV. In some embodiments, the charge-tapping layer may include one or more of: hafnium oxide ($HfO_2$), yttrium oxide ($Y_2O_3$), silicon nitride ($Si_3N_4$), zirconium oxide ($ZrO_2$), zirconium silicon oxide ($ZrSiO_4$), lanthanum oxide ($La_2O_3$) tantalum oxide ($Ta_2O_5$), cerium oxide ($CeO_2$), titanium oxide ($TiO_2$), strontium titanium oxide ($SrTiO_3$), other semiconductors, and metal nanodots (e.g., silicon, ruthenium, platinum and cobalt nanodots).

According to one embodiment of the present invention, the storage transistor may further include a barrier layer between the tunnel dielectric layer and the charge-trapping layer, the barrier layer having a conduction band offset less than the conduction band offset of the charge-trapping layer. The barrier layer may also include a material having a conduction band offset between $-1.0$ eV and 2.3 eV, preferably between $-1.0$ eV to 1.5 eV, such as one or more of: hafnium oxide ($HfO_2$), yttrium oxide ($Y_2O_3$), silicon nitride ($Si_3N_4$), zirconium oxide ($ZrO_2$), zirconium silicon oxide ($ZrSiO_4$), tantalum oxide ($Ta_2O_5$), cerium oxide ($CeO_2$), titanium oxide ($TiO_2$), strontium titanium oxide ($SrTiO_3$), other semiconductors, and metal nanodots (e.g., silicon, ruthenium, platinum and cobalt nanodots).

In one embodiment, when a voltage substantially less than the programming voltage is applied across the channel region and the gate electrode, electrons tunnel into the charge-trapping layer by Fowler-Nordheim turnneling through an energy barrier that is wider than the thickness of the tunnel dielectric layer.

In one embodiment, the tunnel dielectric layer may be as thin as 5-40 Å and may be formed out of silicon oxide (e.g., $SiO_2$) or silicon nitride (SiN). A silicon oxide tunnel dielectric layer may be formed using conventional oxidation techniques (e.g., a high-temperature oxidation), chemical synthesis (e.g., atomic layer deposition (ALD)), or any suitable combination of these techniques. A reactive $O_2$ process may include ozone for a precisely controlled thickness and an improved oxide quality (e.g., reduced leakage due to defect sites). A silicon nitride tunnel dielectric layer may be formed using conventional nitridation, direct synthesis, chemical synthesis (e.g., by atomic layer deposition), or any suitable combination of these techniques. A plasma process may be used for a precisely controlled thickness and an improved dielectric quality (e.g., reduced leakage due to defect sites).

The tunnel dielectric layer may also include in addition a thin aluminum oxide ($Al_2O_3$) layer (e.g., 10 Å or less). The aluminum oxide layer in the tunnel dielectric layer may be synthesized in the amorphous phase, to reduce leakage due to defect sites.

The present invention is better understood upon consideration of the detailed description below in conjunction with the accompanying drawings.

BRIEF DESCRIPTION OF THE DRAWINGS

FIG. 5 is an energy band diagram in an exemplary storage transistor having channel region 501, tunnel dielectric layer 502 and charge-trapping layer 503.

FIGS. 6(a), 6(b) and 6(c) show, respectively, (i) the lowest energy levels of the conduction bands at substrate 501, tunnel dielectric 502 and charge-trapping layer 503 of a storage transistor; (ii) the lowest energy levels in the conduction bands of these layers of the storage transistor without application of a voltage; and (iii) the electron energy offset 515 between substrate 501 and charge-trapping layer 503, when an erase voltage is applied.

FIGS. 7(a), 7(b) and 7(c) show, respectively, (i) the relative conduction band offsets at substrate 601, tunnel dielectric 602, low conduction band offset (LCBO) barrier layer 603, and charge-trapping layer 604 of a storage transistor; (ii) an energy band diagram of these layers of the storage transistor without application of a voltage; and (iii) electron energy offset 615 between substrate 601 and charge-trapping layer 604, when an erase voltage is applied.

FIGS. 10(a) and 10(b) are band diagrams for the structure during programming and erase operations, based on a one-volt drop across tunnel dielectric layer 602 (i.e., b=1 eV, during a programming operation and b'=1 eV, during an erase operation).

DETAILED DESCRIPTION OF THE PREFERRED EMBODIMENTS

Figure 1:
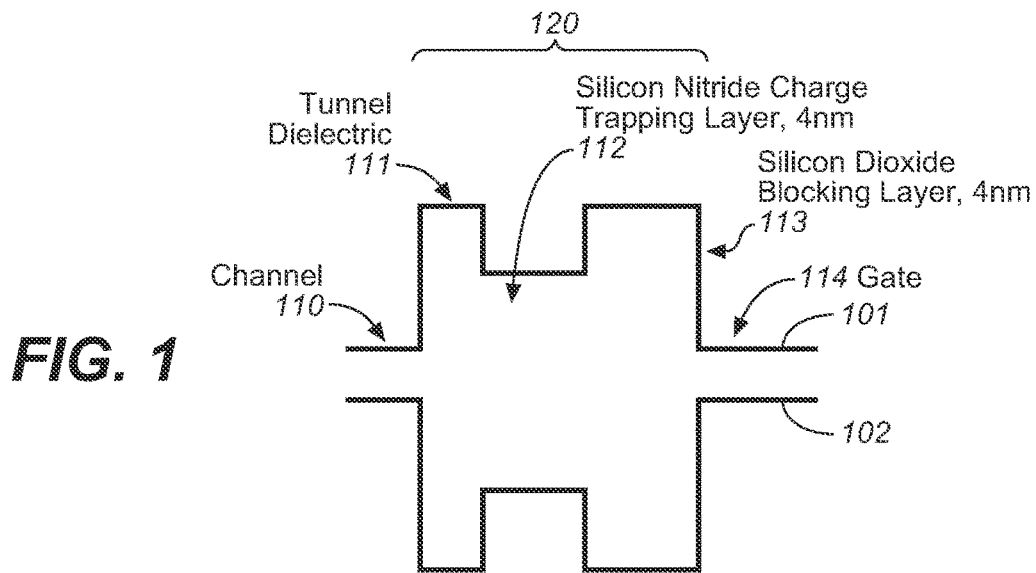
FIG. 1 is an energy band diagram of a conventional storage transistor, which includes multiple sublayers of dielectric materials and stores charge between a channel region and a gate electrode.
Figure 2:
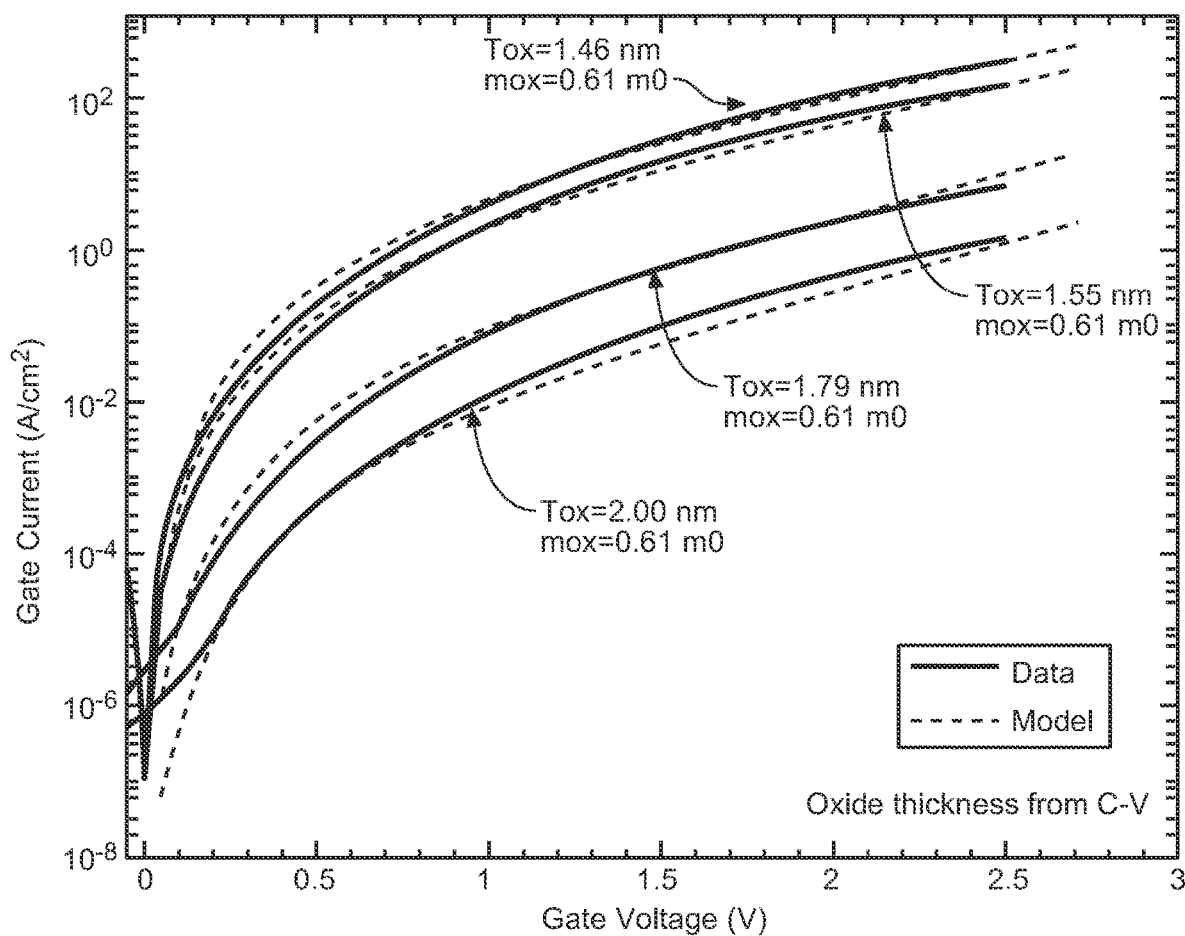
FIG. 2 shows some typical direct tunneling current densities (gate currents) for various silicon dioxide thicknesses under different bias conditions.
Figure 3A:
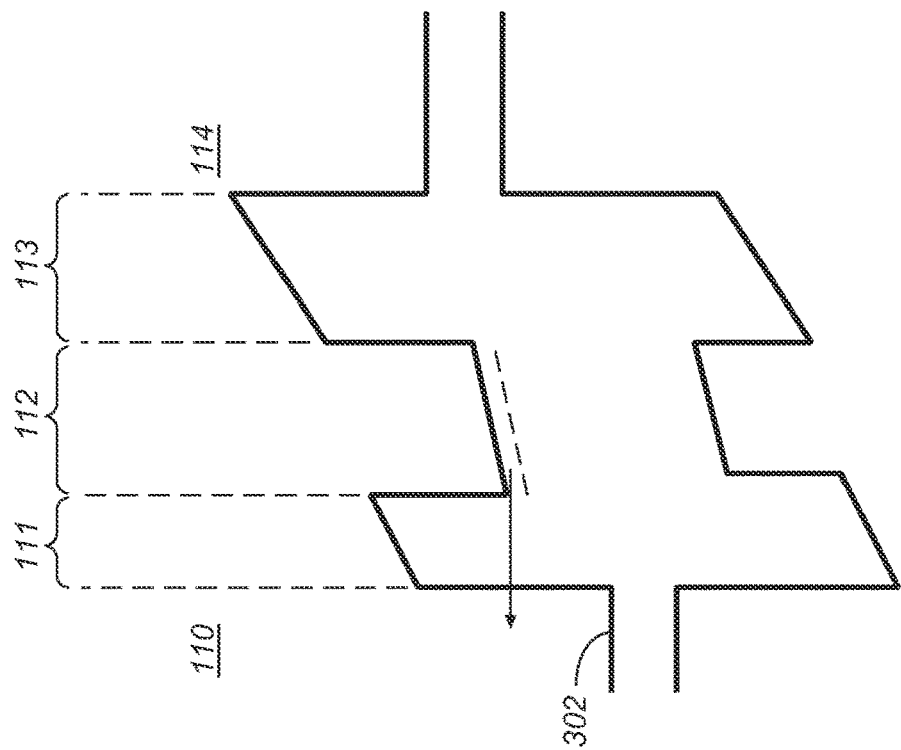
FIGS. 3(a) and 3(b) illustrate, respectively, direct tunneling of electrons into charge-trapping sublayer 112 and out of charge-trapping sublayer 112 during programming and erase operations.
Figure 3B:
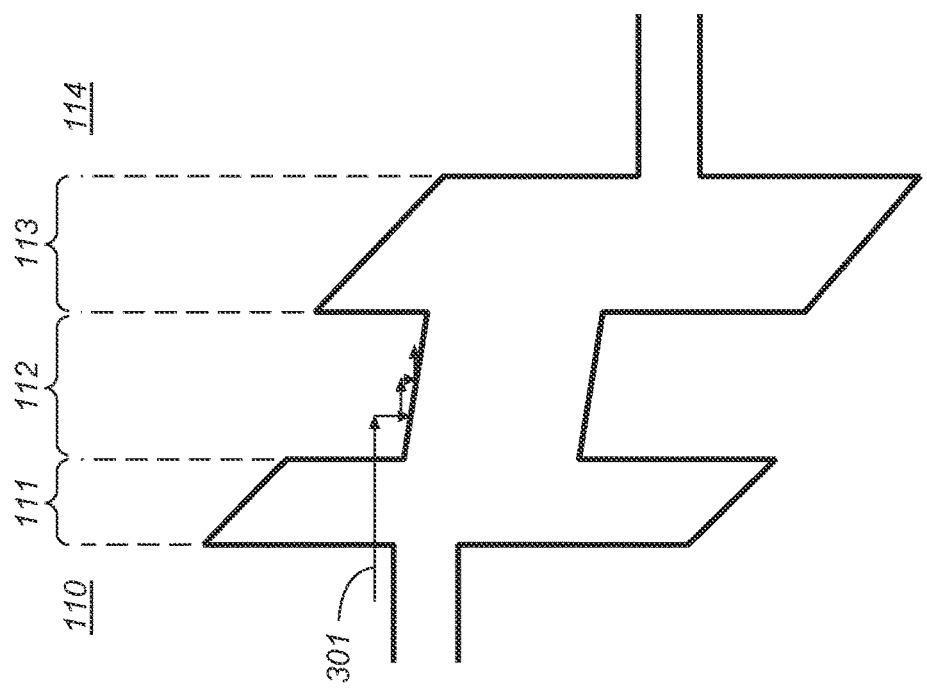
Figure 4:
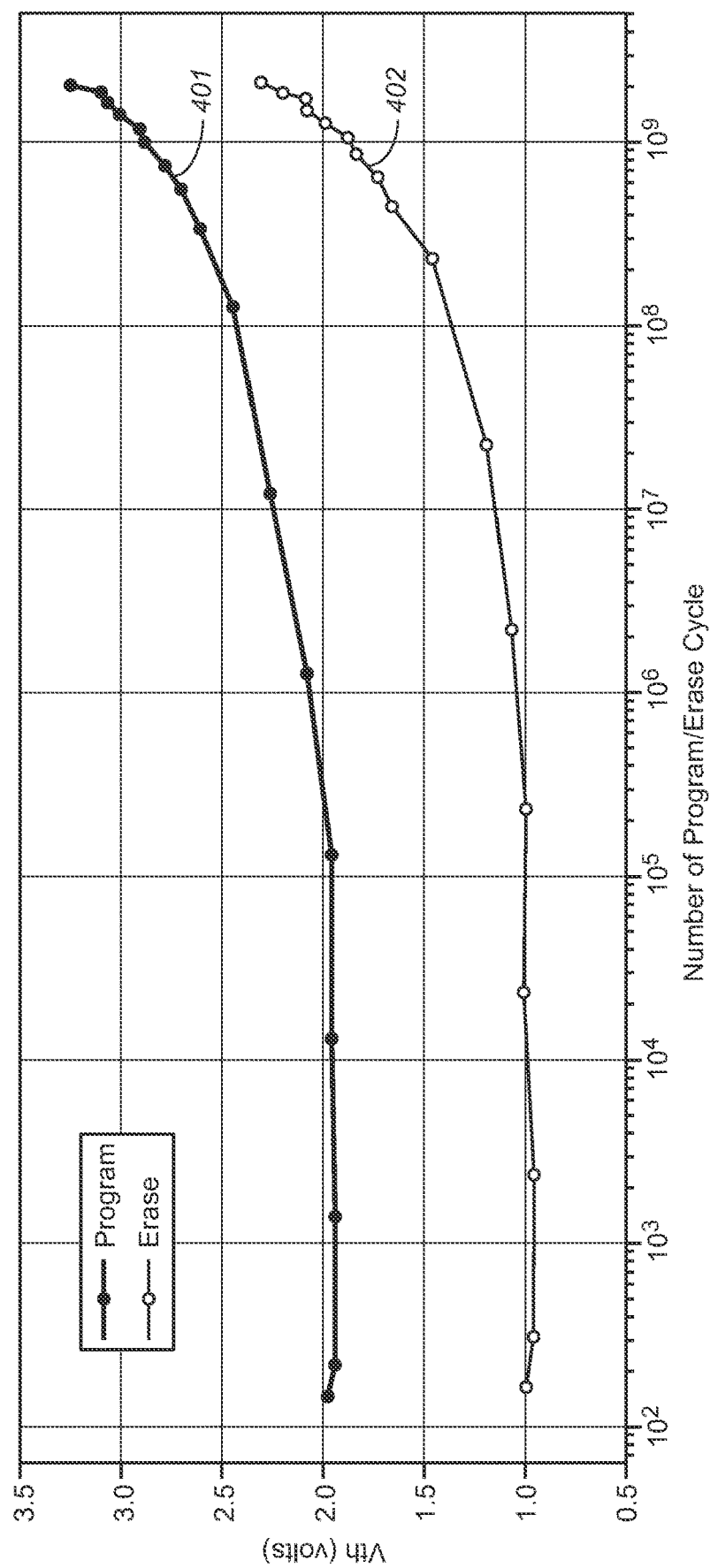
FIG. 4 illustrates an evolution of the programming window in a storage transistor over more than $10^9$ program and erase cycles, showing program state threshold voltage 401 and erase state threshold voltage 402.

The present invention improves endurance in a storage transistor to exceed $10^{11}$ program-erase cycles using a device structure that ensures electrons tunneling out of a charge-trapping layer into the channel region of the storage transistor (e.g., during an erase operation) are within a desirable low energy range ("cool electrons"), such that any resulting hole generations are also low-energy and are thus less damaging to the programming window. The device structure provides a substantial direct tunneling programming current density exceeding 1.0 amps/cm$^2$ (e.g., 5.0 amps/cm$^2$). The present invention is particularly advantageous for use in storage layers of thin-film storage transistors that are formed in 3-dimensional memory structures, such as those quasi-volatile storage transistors in the 3-dimensional arrays of NOR memory strings disclosed in Harari discussed above.

One embodiment of the present invention is illustrated by the model of FIG. 5, showing the conduction and valence energy band boundaries 511 and 512 of an exemplary storage transistor having channel region 501, tunnel dielectric layer 502 and charge-trapping layer 503. As FIG. 5 illustrates, arrow 514 represents electrons direct tunnel from charge-trapping layer 503 to channel region 501. The energy difference ("conduction band offset") between the lowest energy levels in the conduction bands of charge-trapping layer 503 and channel region 501—indicated by reference numeral 515—is the expected energy loss by an electron so tunneled.

The present invention may be achieved by judiciously selecting a combination of materials for a tunnel dielectric material and a charge-trapping dielectric material, to obtain desirable conduction band offsets at these layers relative to the semiconductor substrate (i.e., the channel region) of the storage transistor. FIG. 6(a) shows the lowest energy levels of the conduction bands at substrate 501, tunnel dielectric 502 and charge-trapping layer 503 of the storage transistor. FIG. 6(b) shows the lowest energy levels in the conduction bands of these layers of the storage transistor without application of a voltage. FIG. 6(c) shows the electron energy offset 515 between substrate 501 and charge-trapping layer 503, when an erase voltage is applied. Electron energy offset 515 depends on conduction band offsets between substrate 501 and each of tunnel dielectric layer 502 and charge-trapping layer 503, as well as on the voltage applied for the erase operation. As illustrated in FIG. 6(c), for tunnel dielectric layer 502, using different charge-trapping materials as charge-trapping layer 503, with different conduction band offsets relative to the substrate layer 501, results in greater or lesser energy loss in the tunneling electrons reaching substrate 501. Likewise, for charge-trapping layer 503, using different tunnel dielectric materials as tunnel dielectric layer 502, with different conduction band offsets relative to the substrate layer 501, also results in greater or lesser energy loss in the tunneling electrons reaching substrate 501.

Tunnel dielectric layer 502 may be as thin as 5-40 Å and may be formed out of silicon oxide (e.g., SiO$_2$), silicon nitride (SiN), or silicon oxynitride (SiON). A silicon oxide tunnel dielectric layer may be formed using conventional oxidation techniques (e.g., a high-temperature oxidation), chemical synthesis (e.g., atomic layer deposition (ALD)), or any suitable combination of these techniques. A reactive O$_2$ process may include an ozone step (e.g., using pulsed ozone) for a precisely controlled thickness and an improved oxide quality (e.g., reduced leakage due to defect sites). The ozone step augments solidification of the oxide in a conformal manner, which is particularly advantageous for three-dimensional transistor structures. An annealing step (e.g., an H$_2$ anneal, a NH$_3$ anneal, or a rapid thermal annealing) may also fortify tunnel dielectric layer 502. A silicon nitride tunnel dielectric layer may be formed using conventional nitridation, direct synthesis, chemical synthesis (e.g., by ALD), or any suitable combination of these techniques. A plasma process may be used for a precisely controlled thickness and an improved dielectric quality (e.g., reduced leakage due to defect sites).

Tunnel dielectric layer 502 may also include an additional thin aluminum oxide (Al$_2$O$_3$) layer (e.g., 10 Å or less). This additional aluminum oxide layer in the tunnel dielectric layer may be synthesized in the amorphous phase, to reduce leakage due to defect sites.

The following materials may be used to provide tunnel dielectric layer 502 and charge-trapping layer 503:

| Material | Conduction Band Offset |
| --- | --- |
| Silicon oxide (SiO$_2$) | 3.15 eV |
| Hafnium oxide (HfO$_2$) | 1.5 eV |
| Silicon Nitride (Si$_3$N$_4$) | 2.4 eV |
| Yttrium oxide (Y$_2$O$_3$) | 2.3 eV |
| Zirconium oxide (ZrO$_2$) | 1.4 eV |
| Zirconium silicon oxide (ZrSiO$_4$) | 1; 5 eV |
| Lanthanum oxide (La$_2$O$_3$) | 2.3 eV |
| Silicon oxinitrides (SiN:H) | 1.3-2.4 eV |
| Tantalum oxide (Ta$_2$O$_5$) | 0.3 eV |
| Cerium oxide (CeO$_2$) | 0.6 eV |
| Titanium oxide (TiO$_2$) | 0.0 eV |
| Strontium titanium oxide (SrTiO$_3$) | 0.0 eV |
| Silicon-rich silicon nitride (SiN:Si) | 1.35 eV |
| Silicon nanodots | 0.0 eV |
| Ruthenium nanodots | −0.7 eV |
| Cobalt nanodots | −1.0 eV |

Using a lower conduction band offset in the charge-trapping layer provides an effective increase in tunneling barrier in the tunnel dielectric layer, resulting in improved data retention.

Alternatively, a barrier material of low conduction band offset may be introduced into the storage transistor between the tunnel dielectric layer and the charge-trapping layer. FIGS. 7(a)-7(c) are band diagrams representative of such a structure. FIG. 7(a) shows the relative conduction band offsets at substrate 601, tunnel dielectric 602, low conduction band offset barrier dielectric 603 and charge-trapping layer 604 of the storage transistor. FIG. 7(b) is an energy band diagram of these layers of the storage transistor without application of a voltage. FIG. 7(c) shows the electron energy offset 615 between substrate 601 and charge-trapping layer 604, when an erase voltage is applied. Electron energy offset 615 depends on conduction band offsets between substrate 601 and each of tunnel dielectric layer 602, low conduction band offset barrier layer 603 and charge-trapping layer 604, as well as on the voltage applied for the erase operation. As shown in FIGS. 7(a)-7(c), low conduction band offset (LCBO) barrier dielectric 603 preferably has a conduction band offset relative to substrate 601 that is lower than those of both tunnel dielectric layer 602 and charge-trapping layer 604. Judiciously choosing the materials for tunnel dielectric layer 602, LCBO barrier layer 603, and trapping layer 604, cool electron direct tunneling may be achieved for both program and erase operations, resulting in a high endurance in the storage transistor.

Figure 8A:
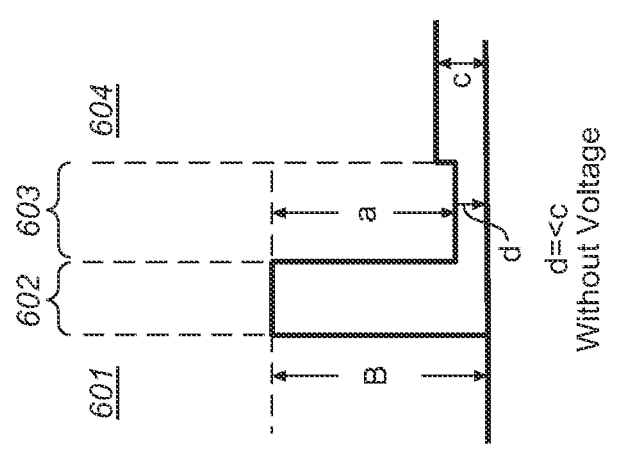
FIGS. 8(a), 8(b) and (c) illustrate the conduction band offset parameters for dielectric layers 602-604 illustrated in FIGS. 7(a)-7(c).
Figure 8B:
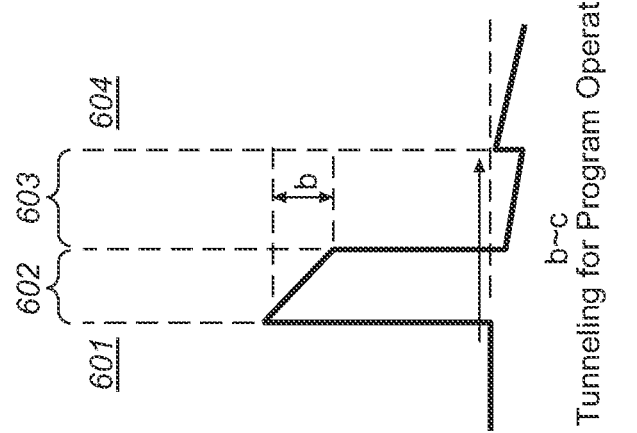
Figure 8C:
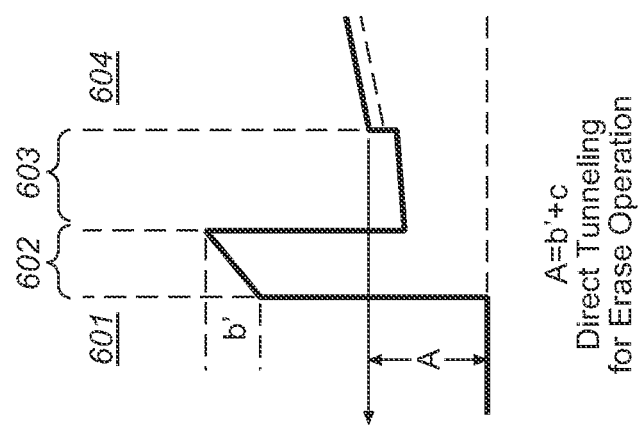

FIGS. 8(a)-(c) illustrates illustrate the conduction band offset parameters for dielectric layers 602-604 illustrated in FIGS. 7(a)-7(c). As shown in FIG. 8(a), (i) parameter B represents the conduction band offset of tunnel dielectric layer 602 relative to substrate 601, (ii) parameter a represents the conduction band offset of LCBO barrier layer 603 relative to the conduction band offset of tunnel dielectric layer 602, (iii) parameter d represents the conduction band offset of LCBO barrier layer 603 relative to substrate 601, and (iv) parameter c represents the conduction band offset of charge-trapping layer 604 relative to substrate 601. According to one embodiment of the present invention, the conduction band offset of LCBO barrier layer 603 should not be greater than the conduction band offset of charge-trapping layer 604 (i.e., d≤c) to allow a substantial direct tunneling programming current density exceeding 1.0 amps/cm$^2$ (e.g., 5.0 amps/cm$^2$).

FIG. 8(b) shows sloping of the energy level at the bottom of the conduction band of tunnel dielectric layer 602 as a result of the programming voltage. The sloping lowers the energy level of tunnel dielectric layer 602 by parameter b over the thickness of tunnel dielectric layer 602. For the programming operation to be effectuated by direct tunneling, the value of parameter b should be greater or equal to the value of parameter c (i.e., b≥c). The value of parameter b (in eV units) is the product of the voltage drop across tunnel dielectric layer 602 and the electron charge q (i.e., 1.6×10$^{-19}$ coulombs).

When the voltage drop across tunnel dielectric 602 is less than the conduction band offset of charge-trapping layer 604 (i.e., b<c), the tunneling barrier becomes wider, as at least a part of LCBO barrier layer 603 remains a tunneling barrier. In that case, direct tunneling may give way to a modified Fowler-Nordheim (MFN) mechanism, which provides a much smaller current than direct tunneling (e.g., less than 0.1 amps/cm$^2$).

Figure 9C:
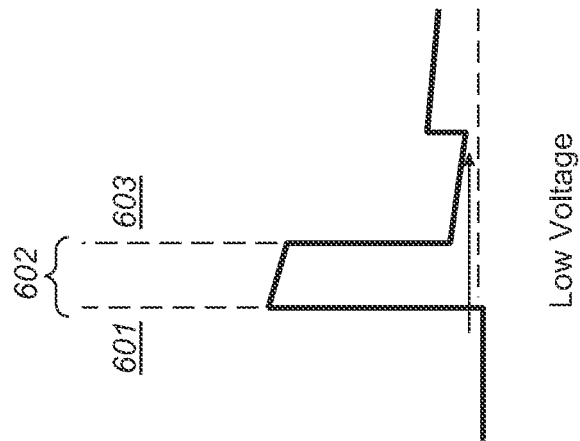
FIG. 9(a) illustrates direct tunneling and FIGS. 9(b) and 9(c) illustrate MFN tunneling in the storage transistor of FIGS. 7(a)-7(c).
Figure 9B:
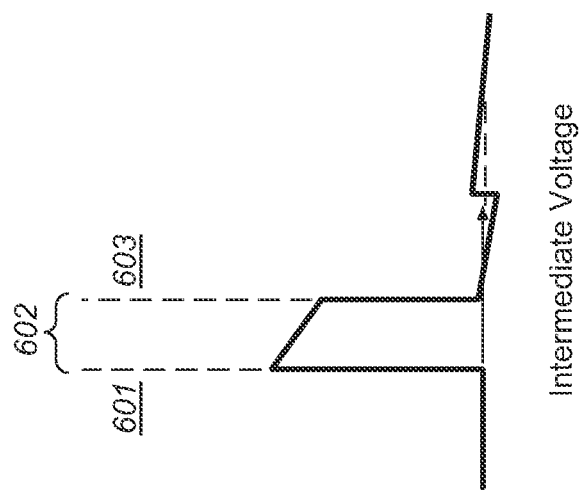
Figure 9A:
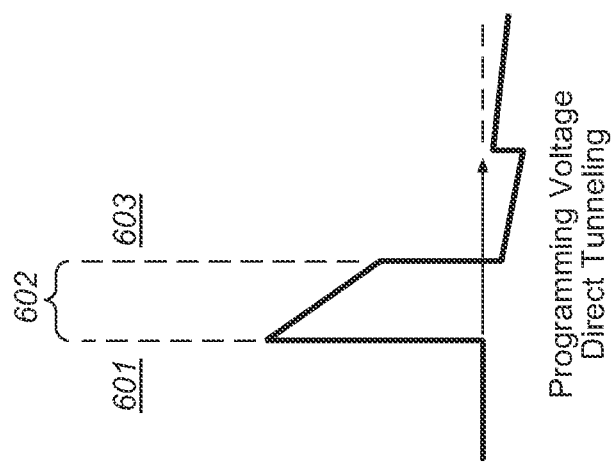

FIG. 9(a) illustrates direct tunneling, under application of a programming voltage, and FIGS. 9(b) and 9(c) illustrate MFN tunneling, under a lower voltage ("intermediate") and an even lower voltage, respectively, in the storage transistor of FIGS. 7(a)-7(c). One may recognize that MFN tunneling may occur in a region of low voltage disturbs during operations of the storage transistor. However, for a storage transistor having the structure illustrated in FIGS. 7(a)-7(c), this MFN tunneling current can be very low for a range of voltages applied. The materials and the thicknesses for charge-trapping layer 604 and barrier layer 603 are selected such that read disturb voltages, programming inhibit voltages or erase inhibit voltages fall within the range of low or intermediate voltages that restrict tunneling to the MFN mechanism.

Thus, the storage transistor of the present invention provides an important advantage: high currents at the programming voltage due to direct tunneling, while having merely a low MFN tunneling current when exposed to a low voltage. This characteristic reduces disturbs during read, programming inhibit, or erase inhibit operations and improves data retention and endurance, particularly in quasi-volatile storage transistors of the present invention that use direct tunneling for fast programming and fast erase operations. In this regard, LCBO barrier layer 603 improves endurance by enabling cool electron-erase operations, which reduces device degradation, as the resulting holes generated in the channel region are low-energy.

By restricting tunneling at low voltages to MFN tunneling, LCBO barrier layer 603 also improve data retention and reduces read disturb, programming-inhibit disturbs and erase-inhibit disturbs, as the read disturbs, programming-inhibit disturbs and erase-inhibit disturbs all occur at low voltages. For example, programming-inhibit disturbs and erase-inhibit disturbs occur at half-select or a lower voltage than that used in the respective programming and erase operations. All these benefits accrue in the storage transistors biased at low voltages, while at the same time maintaining the advantages of the high efficiency of direct tunneling accrue in the storage transistors biased at the higher read, programming or erase voltages.

FIG. 8(c) shows sloping of the energy level at the bottom of the conduction band of tunnel dielectric layer 602 during an erase operation. The sloping raises the energy level of tunnel dielectric layer 602 by parameter b' over the thickness of tunnel dielectric layer 602. During the erase operation, electrons in direct tunneling from charge-trapping layer 604 to substrate 601 loses an energy represented by parameter A, which is given by: A=b'+c. Note that the conduction band offset of charge-trapping layer 604 should be greater than the amount by which the energy level of a charge-trapping site is below the conduction band of charge-trapping layer 604 in order for the electrons at the charge-trapping site to be included in the direct tunneling current.

According to one embodiment of the present invention, substrate 601 may be implemented by a P-doped silicon, tunnel dielectric layer 602 may be implemented by a 1-nm thick SiO$_2$ layer (B=3.15 eV), low conduction band offset barrier layer 603 may be implemented by a 2-nm thick Ta$_2$O$_5$ layer (d=0.3 eV), charge-trapping layer 604 may be implemented by a 4-nm thick silicon-rich silicon nitride (i.e., SiN:Si; c=1.35 eV)[1], and another 4-nm thick SiO$_2$ layer may be used to provide a blocking dielectric layer. Gate electrode 606 may be implemented by a highly-doped P-type polysilicon. FIGS. 10(a) and 10(b) are band diagrams for the structure during programming and erase operations, based on a one-volt drop across tunnel dielectric layer 602 (i.e., b=1 eV, during a programming operation and b'=1 eV, during an erase operation). As shown in FIG. 10(b), as indicated by arrow 1001, an electron reaching substrate 601 by direct tunneling loses about 1.4 eV of energy during the erase operation. Scattering in LCBO barrier layer 603, as indicated by arrow 1002, may further reduce this energy loss.

Unlike silicon nitride (stoichiometrically, Si$_3$N$_4$), silicon-rich silicon nitride includes silicon as impurity, which reduces silicon nitride's band gap from 4.6 eV to about 3.6 eV for silicon-rich silicon nitride. Also, silicon nitride has a refractive index of 2.0, while silicon-rich silicon nitride has a refractive index in the range of 2.1-2.3.

According to another embodiment of the present invention, substrate 601 may be implemented by a P-doped silicon, tunnel dielectric layer 602 may be implemented by a 1-nm thick SiO$_2$ layer (B=3.15 eV), low conduction band offset barrier layer 603 may be implemented by a 2-nm thick CeO$_2$ layer (d=0.6 eV), charge-trapping layer 604 may be implemented by a 4-nm thick silicon-rich silicon nitride (i.e., Si$_3$N$_{r4}$:Si; c=1.35 eV), and another 5-nm thick SiO$_2$ layer may be used to provide a blocking dielectric layer. Gate electrode 606 may be implemented by a highly-doped P-type polysilicon.

FIG. 11(a)-11(d) show various simulation results for storage transistors of the present invention.

Figure 11A:
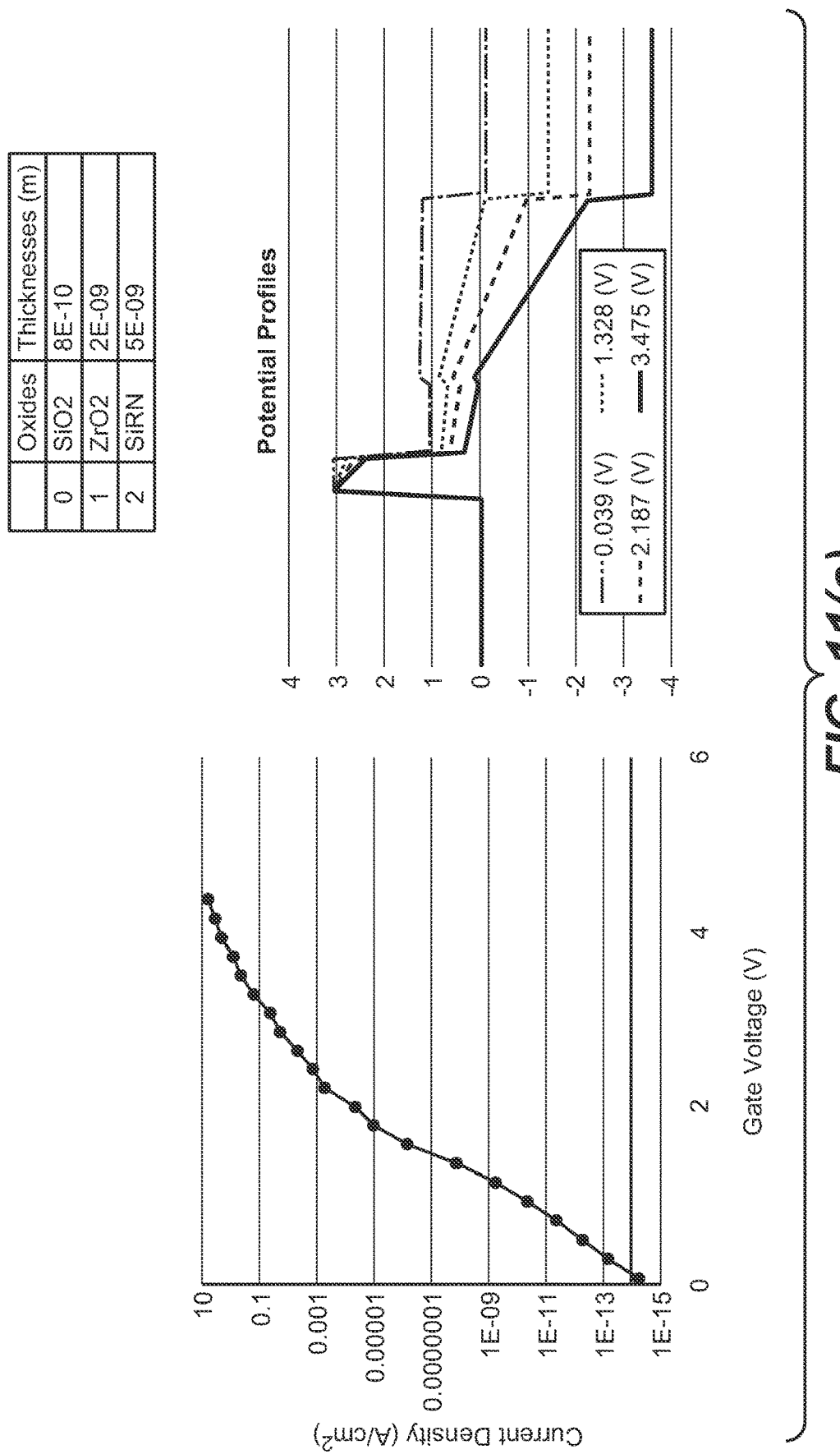
FIGS. 11(a), 11(b), 11(c) and 11(d) show various simulation results for storage transistors of the present invention.

FIG. 11(a) shows a simulation of a storage transistor having a 0.8 nm thick silicon oxide tunneling dielectric layer, a 2.0 nm thick zirconium oxide LCBO barrier layer and a 5.0 nm thick silicon-rich silicon nitride trapping layer. FIG. 11(a) shows that a direct-tunneling current density exceeding 1.0 amps/cm² is achieved with a programming voltage around 3.1 volts.

Figure 11B:
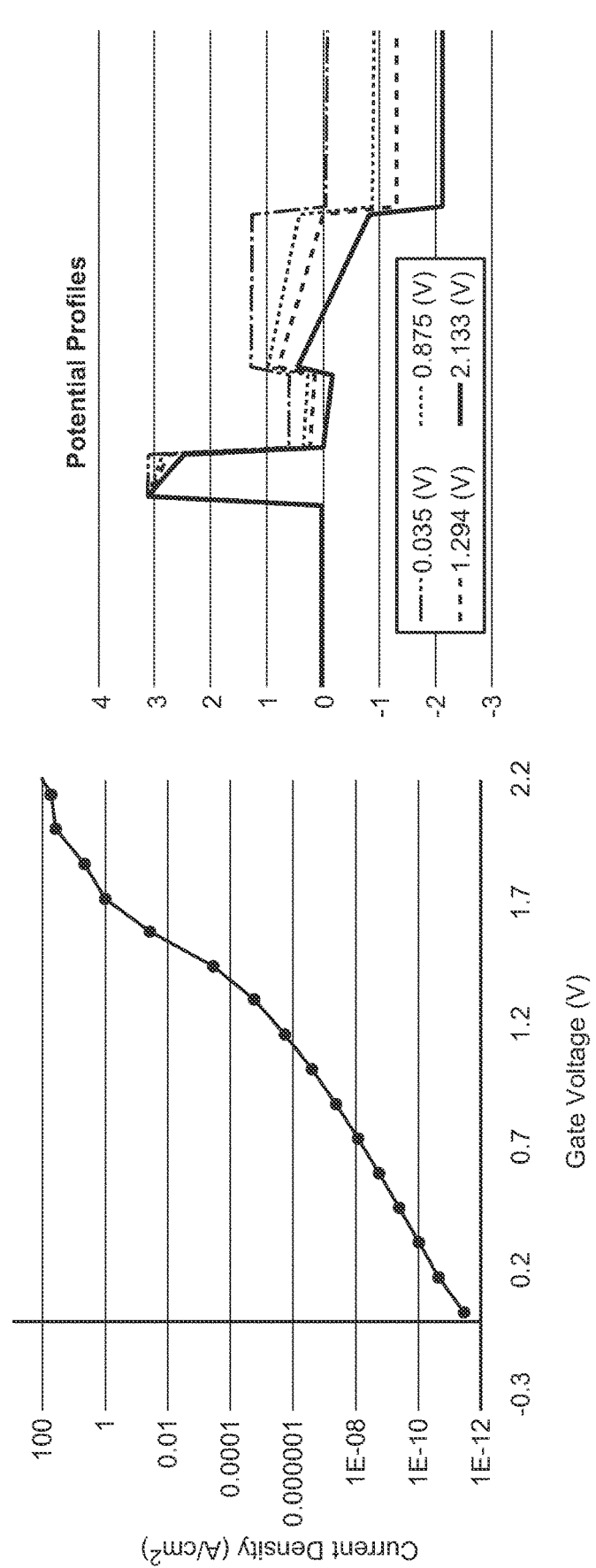

FIG. 11(b) shows a simulation of a storage transistor having a 1.0 nm thick silicon oxide tunneling dielectric layer, a 2.0 nm thick cerium oxide LCBO barrier layer and a 4.0 nm thick silicon-rich silicon nitride trapping layer. FIG. 11(b) shows that a direct-tunneling current density exceeding 1.0 amps/cm² is achieved with a programming voltage around 1.6 volts.

Figure 11C:
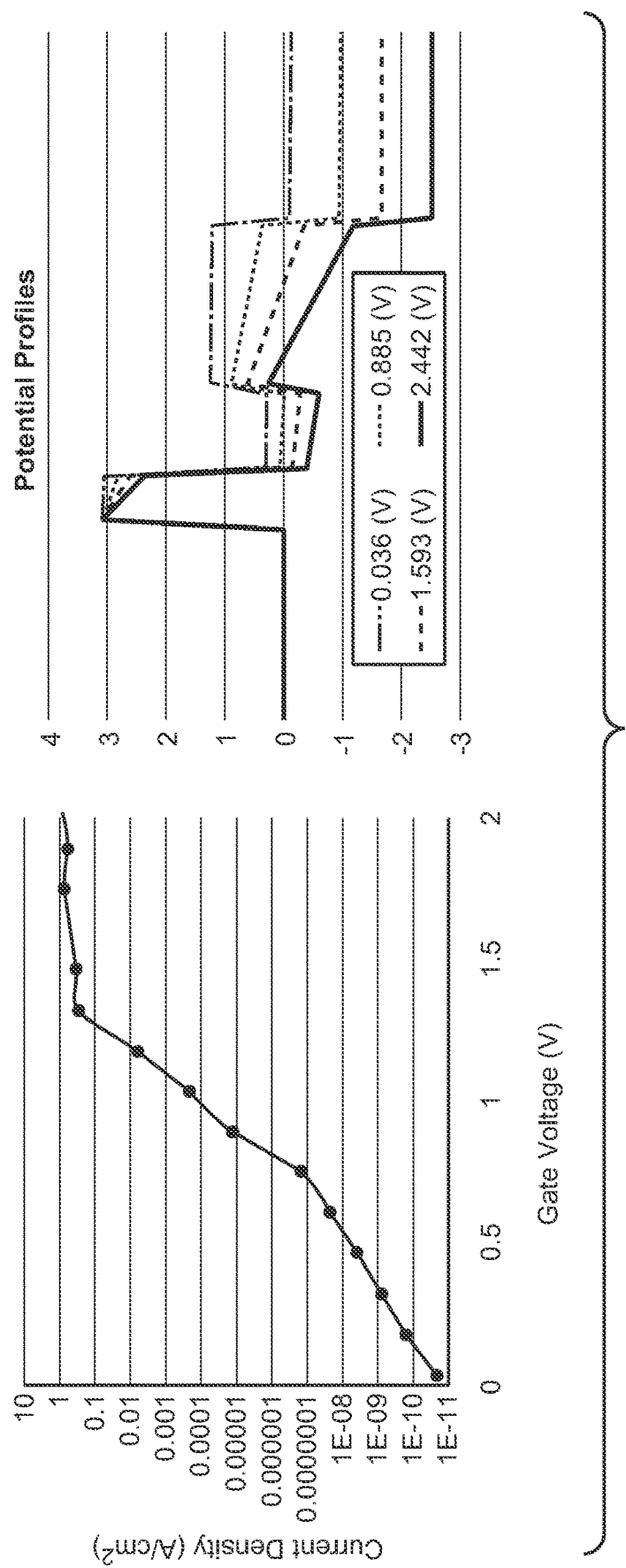

FIG. 11(c) shows a simulation of a storage transistor having a 1.0 nm thick silicon oxide tunneling dielectric layer, a 2.0 nm thick tantalum oxide LCBO barrier layer and a 4.0 nm thick silicon-rich silicon nitride trapping layer. FIG. 11(c) shows that a direct-tunneling current density exceeding 1.0 amps/cm² is achieved with a programming voltage around 1.8 volts.

Figure 11D:
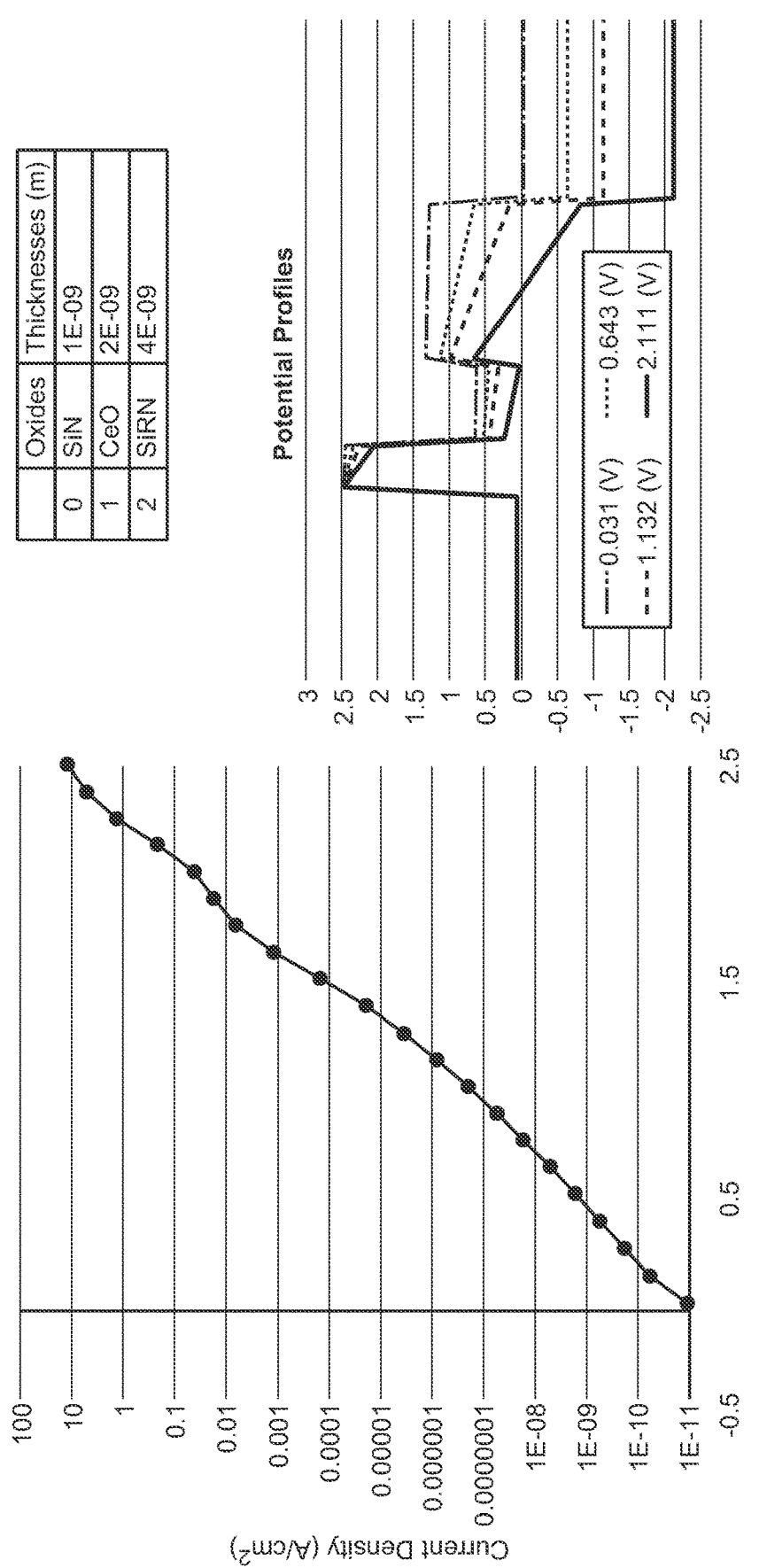

FIG. 11(d) shows a simulation of a storage transistor having a 1.0 nm thick silicon nitride tunneling dielectric layer, a 2.0 nm thick cerium oxide LCBO barrier layer and a 4.0 nm thick silicon-rich silicon nitride trapping layer. FIG. 11(d) shows that a direct-tunneling current density exceeding 1.0 amps/cm² is achieved with a programming voltage around 2.1 volts.

Figure 12B:
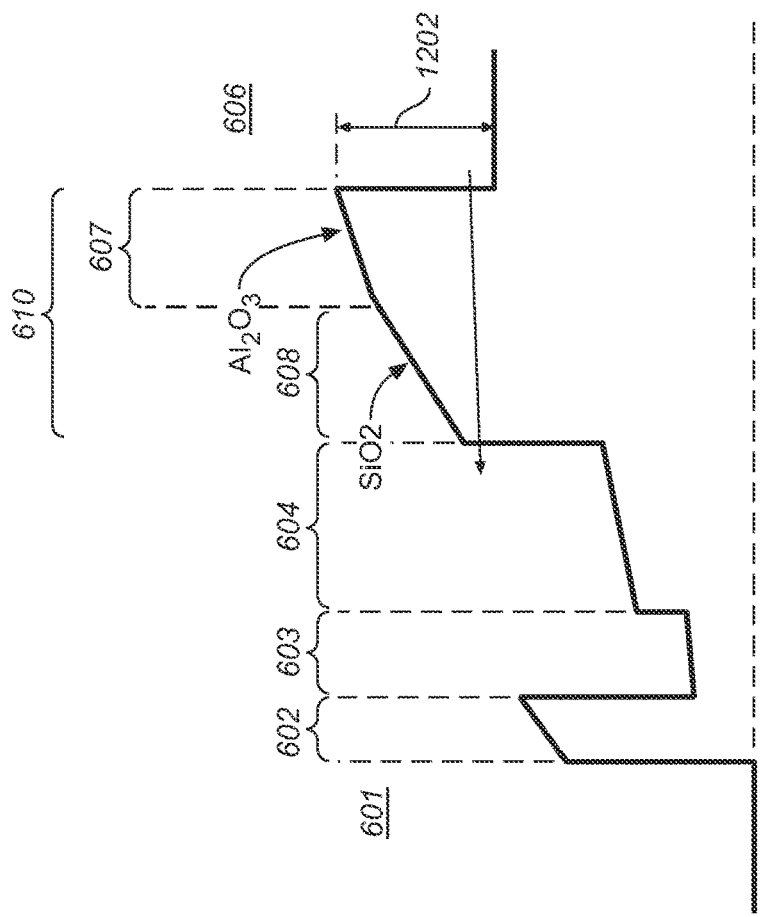
FIG. 12(b) is an energy band diagram for the conduction band of a gate stack of a storage transistor during an erase operation, the storage transistor having additional aluminum oxide layer 607 in blocking dielectric layer 610, according to one embodiment of the present invention
Figure 12A:
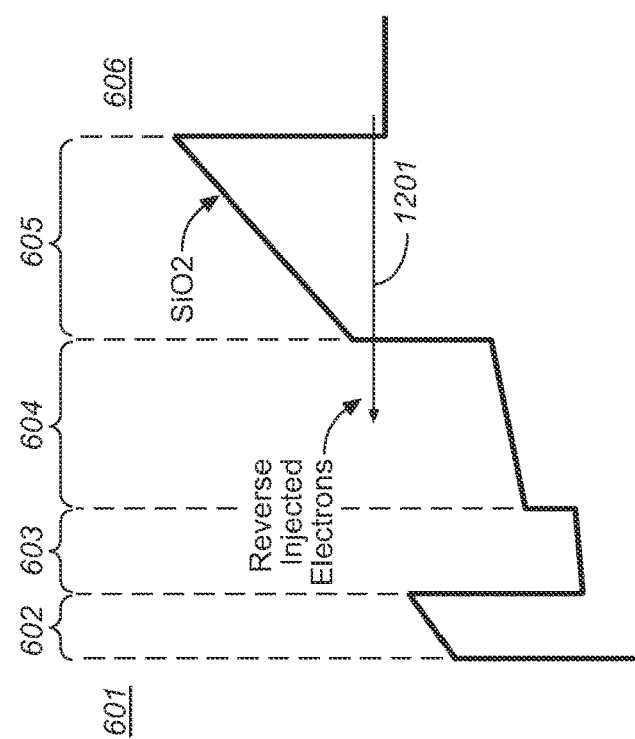
FIG. 12(a) is an energy band diagram for the conduction band of a gate stack of a storage transistor during an erase operation.

FIG. 12(a) illustrates a "reverse injection electrons" phenomenon that may occur during an erase operation. The reverse injection electrons may affect endurance adversely. FIG. 12(a) is an energy band diagram for the conduction band of a gate stack in a storage transistor during an erase operation. As shown in FIG. 12(a), the gate stack includes substrate 601, tunnel dielectric 602, LCBO barrier dielectric 603, charge-trapping layer 604, blocking dielectric layer 605 and gate electrode 606. (Blocking dielectric layer 605 may be, for example, silicon oxide ($SiO_2$)). During an erase operation, the relatively high electric field across blocking dielectric layer 605 may cause high-energy electrons—indicated in FIG. 12(a) by arrow 1201—to tunnel from the gate electrode into charge-trapping layer 604, or even into tunnel dielectric layer 602. These reverse injection electrons may damage these layers, adversely affecting the storage transistor's endurance.

According to one embodiment of the present invention, reverse injection electrons may be significantly reduced or substantially eliminating by including a layer of material with a high dielectric constant ("high-k material"), such as aluminum oxide ($Al_2O_3$) in the blocking dielectric layer (e.g., blocking dielectric layer 605 of FIG. 10(a)). In that embodiment, a high work function metal (e.g., greater than 3.8 eV, preferably not less than 4.0 eV) may be used for gate electrode. A high-k material of $t_H$ provides an equivalent oxide thickness $t_{EOT}$ given by:

$$t_{EOT} = t_H \times \frac{k_{ox}}{k_H}$$

where $k_{ox}$ and $k_H$ are the relative dielectric constants of silicon oxide and the high-k material, respectively. Thus, a high-k material can provide the same desirable transistor characteristics (e.g., gate capacitance) at a thickness of $t_H$, without incurring undesirable leakage of its silicon oxide layer counterpart at the much thinner equivalent thickness $t_{EOT}$.

FIG. 12(b) is an energy band diagram for the conduction band of a gate stack in a storage transistor during an erase operation, the storage transistor having additional aluminum oxide layer 607 in blocking dielectric layer 610, according to one embodiment of the present invention. In FIG. 12(b), blocking dielectric layer 610 includes aluminum oxide layer 607 and silicon oxide layer 608. In one implementation, blocking dielectric layer 610 has an equivalent oxide thickness that is substantially the same as blocking layer dielectric 605 of FIG. 12(a). However, as aluminum oxide has a relative dielectric constant of 9.0, while silicon oxide's relative dielectric constant is 3.9, the actual combined physical thickness of aluminum oxide 607 and silicon oxide 608 in FIG. 12(b) is greater than the thickness of blocking dielectric layer 605 of FIG. 12(a). Because high-k dielectric layer 607 has a greater relative dielectric constant than silicon oxide layer 608, the electric field is lower in high-k dielectric layer 607 than in silicon oxide layer 608. The greater combined physical thickness of blocking dielectric layer 610 of FIG. 12(b)—which provides a wider tunneling barrier between gate electrode 606 and charge-trapping layer 604—and a lower electric field at the interface between gate electrode 606 and high-k material 607 reduce or eliminate reverse injection electrons, thereby resulting in an improved endurance. With high-k electric layer 607 (e.g., aluminum oxide), a high work function metal is preferred for gate electrode 606. The high work function metal creates a high barrier (indicated by barrier height 1202 in FIG. 12(b)) at the gate electrode-aluminum oxide interface, which significantly reduces reverse electron injection the erase operation. Suitable high work function metals include: tungsten (W), tantalum nitride (TaN), tantalum silicon nitride (TaSiN).

The detailed description above is provided to illustrate specific embodiments of the present invention and is not intended to be limiting. Numerous variations and modifications within the scope of the present invention are possible. The present invention is set forth in the accompanying claims.

We claim:

1. A storage transistor having a tunnel dielectric layer, a charge-trapping layer, and a barrier layer, all of which being provided between a channel region and a gate electrode, wherein (i) the barrier layer is provided between the tunnel dielectric layer and the charge-trapping layer; (ii) the charge-tapping layer has a conduction band offset that is less than the lowering of the tunneling barrier in the tunnel dielectric layer when a programming voltage is applied, such that electrons direct tunnel into the charge-trapping layer; and (iii) the barrier layer has a conduction band offset less than the conduction band offset of the charge-trapping layer.

2. The storage transistor of claim 1, wherein the conduction band offset of the charge-trapping layer is between −1.0 eV and 2.3 eV.

3. The storage transistor of claim 1, wherein the charge-trapping layer comprises a material selected from the group consisting of: hafnium oxide ($HfO_2$), yttrium oxide ($Y_2O_3$), zirconium oxide ($ZrO_2$), zirconium silicon oxide ($ZrSiO_4$), lanthanum oxide ($La_2O_3$) tantalum oxide ($Ta_2O_5$), cerium oxide ($CeO_2$), titanium oxide ($TiO_2$), strontium titanium oxide ($SrTiO_3$), silicon nanodots, ruthenium nanodots, platinum nanodots and cobalt nanodots.

4. The storage transistor of claim 1, wherein the conduction band offset of the charge-trapping layer is greater than the energy difference between a charge-trapping site in the charge-trapping layer and the conduction band edge of the charge-trapping layer.

5. The storage transistor of claim 1, wherein the direct-tunneling provides a current exceeding 1.0 amps/cm$^2$.

6. The storage transistor of claim 1, wherein the tunnel dielectric layer has a thickness that allow programming and erasing operations to be accomplished predominantly by direct tunneling.

7. The storage transistor of claim 1, wherein the tunnel dielectric layer comprises one or more of: silicon oxide, silicon nitride and silicon oxynitride.

8. The storage transistor of claim 1 using tunnel dielectric layer comprises stoichiometric silicon nitride.

9. The storage transistor of claim 7, wherein the tunnel dielectric layer comprises silicon oxide that is formed using an ozone step.

10. The storage transistor of claim 7, wherein the tunnel dielectric layer is formed using a pulsed ozone step, an $H_2$ anneal, a $NH_3$ anneal, a rapid thermal anneal, or any combination thereof.

11. The storage transistor of claim 7, further comprising in the tunnel dielectric layer a layer of aluminum oxide.

12. The storage transistor of claim 11, wherein the aluminum oxide layer has a thickness that is not greater than 1 nm.

13. The storage transistor of claim 1 wherein, when a voltage substantially less than the programming voltage is applied across the channel region and the gate electrode, electrons tunnel into the charge-trapping layer by Fowler-Nordheim tunneling or a modified Fowler-Nordheim tunneling.

14. The storage transistor of claim 13, wherein the applied voltage corresponds to a programming inhibit voltage or an erase inhibit voltage and wherein electrons tunneling into the charge trapping layer provides a current density less than 0.1 amps/cm$^2$.

15. The storage transistor of claim 1, having an average endurance exceeding $10^{11}$ programming-erase cycles.

16. The storage transistor of claim 1, wherein the barrier layer comprises a material having a conduction band offset between −1.00 eV and 1.5 eV.

17. The storage transistor of claim 14, wherein the barrier layer comprises a material selected from the group consisting of: hafnium oxide ($HfO_2$), yttrium oxide ($Y_2O_3$), zirconium oxide ($ZrO_2$), zirconium silicon oxide ($ZrSiO_4$), tantalum oxide ($Ta_2O_5$), cerium oxide ($CeO_2$), titanium oxide ($TiO_2$), silicon-rich silicon nitride (SiN:Si), strontium titanium oxide ($SrTiO_3$), silicon nanodots, ruthenium nanodots, platinum nanodots and cobalt nanodots.

18. The storage transistor of claim 14, wherein the tunnel dielectric layer comprises silicon oxide, the barrier layer comprises tantalum oxide, and the charge-trapping layer comprises silicon-rich silicon nitride.

19. The storage transistor of claim 14, wherein the tunnel dielectric layer comprises silicon oxide, the barrier layer comprises cerium oxide, and the charge-trapping layer comprises silicon-rich silicon nitride.

20. The storage transistor of claim 14, wherein the tunnel dielectric layer comprises silicon nitride, the barrier layer comprises cerium oxide, and the charge-trapping layer comprises silicon-rich silicon nitride.

21. The storage transistor of claim 14, wherein the tunnel dielectric layer comprises silicon oxide, the barrier layer comprises zirconium oxide, and the charge-trapping layer comprises silicon-rich silicon nitride.

22. The storage transistor of claim 14 wherein, when a voltage substantially less than the programming voltage is applied across the channel region and the gate electrode, electrons tunnel into the charge-trapping layer by Fowler-Nordheim turnneling or a modified Fowler-Nordheim tunneling.

23. The storage transistor of claim 1, further comprising a blocking dielectric layer between the charge-trapping layer and the gate electrode.

24. The storage transistor of claim 23, the blocking dielectric layer further comprises a layer of aluminum oxide.

25. The storage transistor of claim 24, wherein the aluminum oxide layer in the blocking dielectric layer has a thickness between 2 nm and 5 nm.

26. The storage transistor of claim 1, wherein the storage transistor is a quasi-volatile memory transistor.

27. The storage transistor of claim 26, wherein storage transistor is one of a plurality of thin-film storage transistors formed in a NOR memory string.

28. The storage transistor of claim 27, wherein the NOR memory string is one of a plurality of NOR memory strings in a 3-dimensional array.

29. The storage transistor of claim 1, wherein the storage transistor is a quasi-volatile memory transistor.

30. The storage transistor of claim 29, wherein storage transistor is one of a plurality of thin-film storage transistors formed in a NOR memory string.

31. The storage transistor of claim 30, wherein the NOR memory string is one of a plurality of NOR memory strings in a 3-dimensional array.

* * * * *